US012550485B2

(12) United States Patent
Tangring

(10) Patent No.: US 12,550,485 B2
(45) Date of Patent: Feb. 10, 2026

(54) OPTOELECTRONIC SEMICONDUCTOR COMPONENT HAVING A GOLD LAYER IN THE EDGE REGION

(71) Applicant: ams-OSRAM International GmbH, Regensburg (DE)

(72) Inventor: Ivar Tangring, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 343 days.

(21) Appl. No.: 18/261,498

(22) PCT Filed: Jan. 19, 2022

(86) PCT No.: PCT/EP2022/051060
§ 371 (c)(1),
(2) Date: Jul. 14, 2023

(87) PCT Pub. No.: WO2022/167219
PCT Pub. Date: Aug. 11, 2022

(65) Prior Publication Data
US 2024/0079521 A1    Mar. 7, 2024

(30) Foreign Application Priority Data
Feb. 8, 2021   (DE) .................... 10 2021 201 131.4

(51) Int. Cl.
*H10H 20/816*   (2025.01)
*H10H 20/819*   (2025.01)
(Continued)

(52) U.S. Cl.
CPC ........ *H10H 20/816* (2025.01); *H10H 20/819* (2025.01); *H10H 20/8312* (2025.01);
(Continued)

(58) Field of Classification Search
CPC ............... H10H 20/816; H10H 20/819; H10H 20/8312; H10H 20/841; H10H 20/8514;
(Continued)

(56) References Cited

U.S. PATENT DOCUMENTS

| 2007/0086211 A1 | 4/2007 | Beeson et al. |
| 2011/0156064 A1* | 6/2011 | Seo ...................... H01L 25/0753 |
| | | 257/E33.069 |

(Continued)

FOREIGN PATENT DOCUMENTS

| DE | 102008034708 A1 | 2/2010 |
| DE | 102008051050 A1 | 4/2010 |

(Continued)

OTHER PUBLICATIONS

International Search Report issued for the corresponding International patent application No. PCT/EP2022/051060, dated May 13, 2022, 5 pages (for informational purposes only).

(Continued)

*Primary Examiner* — Mark W Tornow
(74) *Attorney, Agent, or Firm* — Viering, Jentschura & Partner mbB

(57) ABSTRACT

An optoelectronic semiconductor component may include a semiconductor layer stack configured to generate electromagnetic radiation. The semiconductor layer stack may be arranged over a substrate and structured to form a mesa, so that the semiconductor layer stack is not present in an edge region of the substrate. The component may include a converter element on a side of the semiconductor layer stack that is remote from the substrate. The component may further include a gold layer over the edge region of the substrate in an arrangement plane between the substrate and the semiconductor layer stack.

12 Claims, 3 Drawing Sheets

(51) Int. Cl.
  *H10H 20/831* (2025.01)
  *H10H 20/841* (2025.01)
  *H10H 20/851* (2025.01)
  *H10H 20/857* (2025.01)
(52) U.S. Cl.
  CPC ...... *H10H 20/841* (2025.01); *H10H 20/8514* (2025.01); *H10H 20/857* (2025.01)
(58) Field of Classification Search
  CPC ... H10H 20/857; H10H 20/835; H10H 20/856
  See application file for complete search history.

(56) References Cited

U.S. PATENT DOCUMENTS

| | | | | |
|---|---|---|---|---|
| 2011/0266568 | A1* | 11/2011 | Aldaz | H10H 20/8316 257/E33.068 |
| 2013/0146910 | A1 | 6/2013 | Maute et al. | |
| 2016/0027765 | A1* | 1/2016 | von Malm | H10D 30/6745 257/72 |
| 2016/0155901 | A1* | 6/2016 | Lopez | H10H 20/819 257/13 |
| 2016/0211420 | A1* | 7/2016 | Donofrio | H10H 20/831 |
| 2017/0033267 | A1 | 2/2017 | Tamaki et al. | |
| 2018/0248083 | A1 | 8/2018 | Hoeppel et al. | |

FOREIGN PATENT DOCUMENTS

| | | |
|---|---|---|
| DE | 102010009717 A1 | 9/2011 |
| DE | 102015117198 A1 | 4/2017 |
| KR | 1020160032224 A | 3/2016 |
| WO | 2014139849 A1 | 9/2014 |
| WO | 2015008184 A1 | 1/2015 |

OTHER PUBLICATIONS

Search Report issued for the corresponding German patent application No. 10 2021 201 131.4, dated Apr. 26, 2021, 7 pages (for informational purposes only).

Korean office action issued for the corresponding Korean patent application No. 20237026508, dated Dec. 5, 2024, 5 pages (for informational purposes only).

* cited by examiner

OPTOELECTRONIC SEMICONDUCTOR COMPONENT HAVING A GOLD LAYER IN THE EDGE REGION

CROSS-REFERENCE TO RELATED APPLICATION

The present application is a national stage entry according to 35 U.S.C. § 371 of PCT application No.: PCT/EP2022/051060 filed on Jan. 19, 2022; which claims priority to German patent application 10 2021 201 131.4, filed on Feb. 8, 2021; all of which are incorporated herein by reference in their entirety and for all purposes.

TECHNICAL FIELD

The present disclosure is directed to optoelectronic semiconductor components, in particular those comprising a gold layer over an edge region of a substrate where the gold layer is arranged between the substrate and the semiconductor layer stack.

BACKGROUND

A light-emitting diode (LED) is a light-emitting device which is based on semiconductor materials. For example, an LED comprises a pn junction. If electrons and holes recombine with one another in the region of the pn junction, because—for example—a corresponding voltage is applied, electromagnetic radiation is generated.

There is a general search for new approaches which allow the outcoupling efficiency to be optimized even against the background of increasing miniaturization of the optoelectronic semiconductor components. The search more particularly is for approaches enabling as great a fraction as possible of the electromagnetic radiation generated to be given off externally.

It is an object of the present disclosure to provide an improved optoelectronic semiconductor component.

SUMMARY

An optoelectronic semiconductor component comprises a semiconductor layer stack suitable for generating electromagnetic radiation, the semiconductor layer stack being arranged over a substrate and being structured to form a mesa, so that the semiconductor layer stack is not present in an edge region of the substrate; a converter element on a side of the semiconductor layer stack that is remote from the substrate; and a gold layer over the edge region of the substrate in an arrangement plane between the substrate and the semiconductor layer stack.

For example, the semiconductor layer stack has a first semiconductor layer of a first conductivity type and also a second semiconductor layer of a second conductivity type. The optoelectronic semiconductor component further comprises a first current spreading layer, which is connected to the first semiconductor layer, and a second current spreading layer, which is connected to the second semiconductor layer.

For example, the first current spreading layer is arranged between the second current spreading layer and the semiconductor layer stack, and the first semiconductor layer is arranged between the second semiconductor layer and the first current spreading layer.

According to embodiments, the gold layer is electrically connected to the second current spreading layer. For example, the gold layer is arranged on a side of the second current spreading layer that is remote from the substrate.

According to further embodiments, the gold layer is electrically connected to the first current spreading layer.

According to further embodiments, the gold layer is electrically insulated from the first and from the second current spreading layer.

The optoelectronic semiconductor component may further have a dielectric mirror layer between the semiconductor layer stack and the first current spreading layer, the gold layer being arranged on a side of the dielectric mirror layer that is remote from the converter element. Alternatively, the gold layer may directly border the dielectric mirror layer and be arranged on a side of the dielectric mirror layer that is remote from the converter element.

For example, the converter element overlaps with the edge region of the substrate. According to embodiments, the converter element may be fastened via an adhesive on the semiconductor layer stack. The converter element may be configured as a lamina.

According to embodiments, a second contact region for electrically connecting the second semiconductor layer to the second current spreading layer may run through an inner region of the mesa.

The edge region between the gold layer and the converter element may be free from conducting or semiconductor layers.

BRIEF DESCRIPTION OF THE DRAWINGS

The accompanying drawings serve for the understanding of various embodiments. The drawings illustrate exemplary embodiments and serve, together with the description, to elucidate these embodiments. Further exemplary embodiments and many of the intended advantages are evident directly from the detailed description which follows. The elements and structures shown in the drawings are not necessarily represented true to scale relative to one another. Identical reference signs refer to identical or mutually corresponding elements and structures.

DETAILED DESCRIPTION

Figure 1:
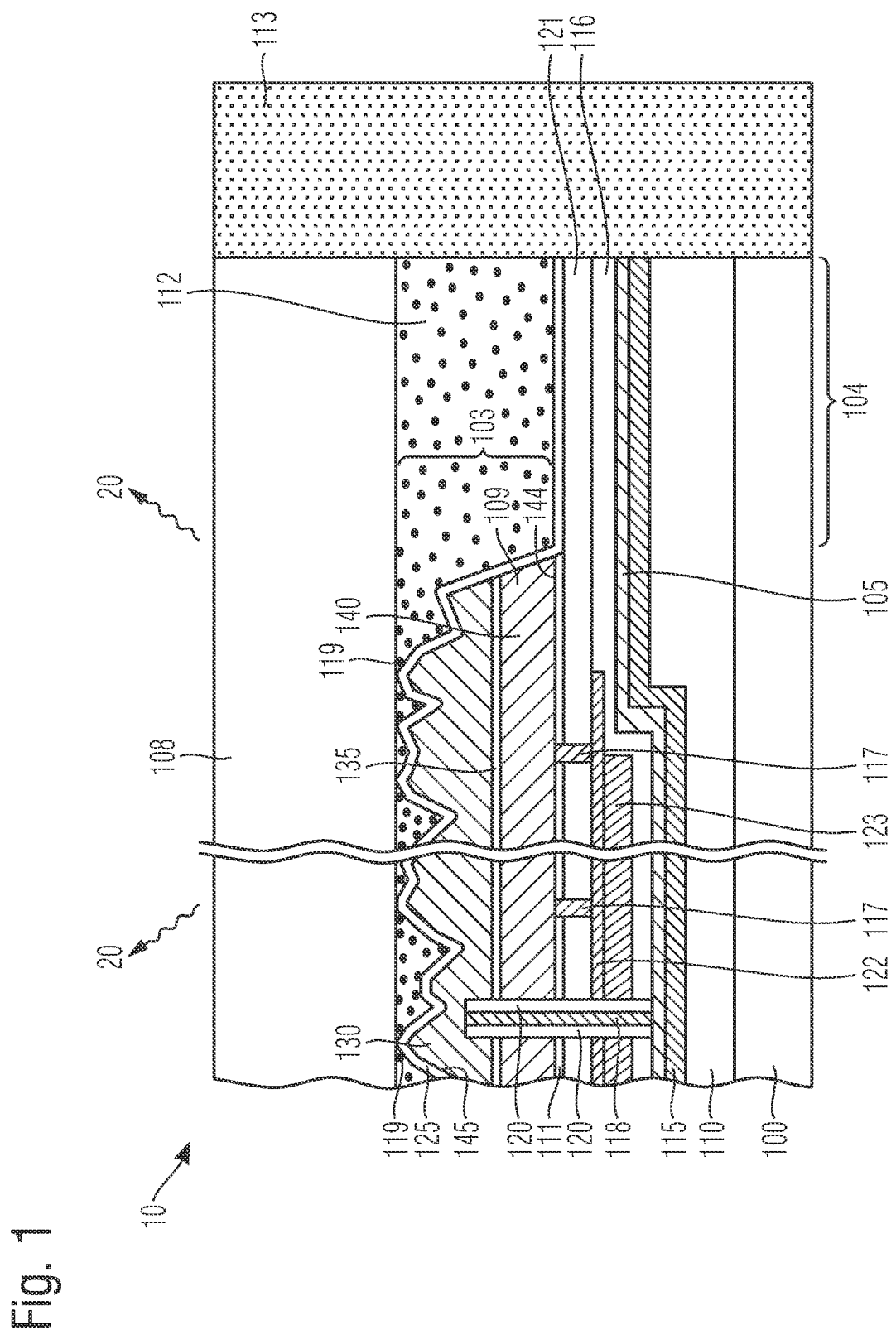
FIG. 1 shows a cross-sectional view through an optoelectronic semiconductor component according to embodiments.

In the detailed description which follows, reference is made to the accompanying drawings, which form a part of the disclosure and in which specific exemplary embodiments are shown for purposes of illustration. In this context, any directional terminology such as "top side", "base", "front side", "rear side", "over", "on", "in front of", "behind", "front", "rear", etc., is based on the orientation of the figures being described. Since the components in the exemplary embodiments may be positioned in different orientations, the directional terminology serves only for elucidation and is in no way limiting.

The description of the exemplary embodiments is not limiting, since there are also other exemplary embodiments in existence, and structural or logical changes may be made without departing from the range defined by the claims. In particular, elements of exemplary embodiments described below may be combined with elements of other exemplary embodiments of the exemplary embodiments described, unless the context dictates otherwise.

The terms "wafer" or "semiconductor substrate" as used in the description below may encompass any semiconductor-based structure which has a semiconductor surface. Wafer and structure are to be understood as including doped and undoped semiconductors, epitaxial semiconductor layers, optionally carried by a base substrate, and further semiconductor structures. For example, a layer may have been grown from a first semiconductor material on a growth substrate composed of second semiconductor material, such as a GaAs substrate, a GaN substrate or an Si substrate, for example, or composed of an insulating material, on a sapphire substrate, for example.

Depending on intended use, the semiconductor may be based on a direct or an indirect semiconductor material. Examples of semiconductor materials particularly suitable for generating electromagnetic radiation encompass, in particular, nitride semiconductor compounds, through which it is possible to generate, for example, ultraviolet, blue or longer-wave light, such as, for example, GaN, InGaN, AlN, AlGaN, AlGaInN, AlGaInBN, phosphide semiconductor compounds, through which it is possible, for example, to generate green or longer-wave light, such as, for example, GaAsP, AlGaInP, GaP, AlGaP, and also further semiconductor materials such as GaAs, AlGaAs, InGaAs, AlInGaAs, SiC, ZnSe, ZnO, $Ga_2O_3$, diamond, hexagonal BN, and combinations of the stated materials. The stoichiometric ratio of the compound semiconductor materials may vary. Further examples of semiconductor materials may encompass silicon, silicon-germanium, and germanium. In the context of the present description, the term "semiconductor" also includes organic semiconductor materials.

The term "substrate" encompasses generally insulating, conducting or semiconductor substrates.

The term "vertical" as used in this description is intended to describe an orientation which runs substantially perpendicular to the first surface of a substrate or semiconductor body. The vertical direction may correspond, for example, to a growth direction in the context of the growing-on of layers.

The terms "lateral" and "horizontal" as used in this description are intended to describe an orientation or alignment which runs substantially parallel to a first surface of a substrate or semiconductor body. This may be, for example, the surface of a wafer or of a chip (die).

The horizontal direction may be situated, for example, in a plane perpendicular to a growth direction in the context of the growing-on of layers.

FIG. 1 shows a schematic cross-sectional view of an optoelectronic semiconductor component according to embodiments. The semiconductor component 10 has a semiconductor layer stack 103 which is suitable for generating an electromagnetic radiation 20. The semiconductor layer stack 103 is arranged over a substrate 100 and is structured to form a mesa 109. As a consequence, the semiconductor layer stack 103 is not present in an edge region 104 of the substrate. There is therefore no semiconductor layer of the semiconductor layer stack 103 arranged over the edge region 104 of the substrate. A converter element 108 is arranged on a side of the semiconductor layer stack 103 that is remote from the substrate 100. The optoelectronic semiconductor component further has a gold layer 105 over the edge region 104 of the substrate 100 in an arrangement plane between the substrate 100 and the semiconductor layer stack 103.

The semiconductor layer stack 103 may have, for example, a first semiconductor layer 140 of a first conductivity type, p-type for example, and also a second semiconductor layer 130 of a second conductivity type, n-type, for example. An active zone 135 may be arranged between the first semiconductor layer 140 and the second semiconductor layer 130.

The active zone may have, for example, a pn junction, a double heterostructure, a single quantum well (SQW) structure or a multi-quantum well (MQW) structure for generating radiation. The designation "quantum well structure" in this context does not carry any significance in terms of the dimensionality of the quantization. It therefore encompasses, among others, quantum wells, quantum wires and quantum dots, and also any combination of these layers.

In particular, the semiconductor layers may each contain GaN, optionally with further elements suitable for emitting blue light.

Electromagnetic radiation that is generated is emitted via a first main surface 145 of the second semiconductor layer 130. The first main surface 145 of the second semiconductor layer 130 may be roughened, to increase the outcoupling efficiency of the electromagnetic radiation that is generated. A dielectric passivation layer 125 may be arranged over the roughened surface of the second semiconductor layer 130 and optionally over a side wall of the first semiconductor layer 140. The dielectric passivation layer may border the first main surface 145 of the second semiconductor layer 130.

A dielectric mirror layer 121 may be arranged bordering a first main surface 144 of the first semiconductor layer 140. Generally, the dielectric mirror layer 121 may have one or more dielectric layers.

A metallic mirror layer 122, composed of silver, Al or other highly reflective materials, for example, may be arranged on a side of the dielectric mirror layer 121 that is remote from the semiconductor layer stack 103. Furthermore, a first current spreading layer 123 may be arranged bordering the metallic mirror layer 122. The first current spreading layer 123 may contain, for example, Ti, Pt, Au or other materials such as Al or Rh, for example. The first semiconductor layer 140 may be connected via first contact regions 117 to the metallic mirror layer 122 or to the first current spreading layer 123. The first contact regions 117 may extend through the dielectric mirror layer 121. A multiplicity of first electrical contact regions 117 may be provided. For example, the first contact regions 117 may be arranged in the interior of the mesa 109, i.e., not at the edge of the mesa but rather at a position which on all sides borders the first semiconductor layer 140.

According to an embodiment, a thin contact layer 111 composed of an electrically conducting material, ITO for example, may further be provided, bordering the first semiconductor layer 140. For example, the first semiconductor layer 140 may contain GaN or InGaAlP. In these cases, through the contact layer 111, a more uniform injection of current can be realized. When a contact layer 111 is used, the first contact regions 117 may extend up to the contact layer 111.

Over a suitable substrate 100, which may for example be conducting, a second current spreading layer 115 is arranged over a solder layer 110. For example, the second current spreading layer 115 may be connected via the solder layer 110 to the substrate 100. The second current spreading layer 115 may contain titanium, for example. For example, the solder layer 110 may comprise a layer sequence which contains a diffusion barrier layer. The second current spreading layer 115 is connected, for example, via second contact regions 118 to the second semiconductor layer 130. The second contact regions 118 may likewise be arranged in the interior of the mesa 109. Multiple second contact regions 118 may be provided. The second contact regions 118 extend through the first semiconductor layer 130, the dielectric mirror layer 121 and the first current spreading layer 123. In particular, the second contact regions 118 do not run over an edge or a side wall of the mesa 109. The second contact regions 118 are electrically insulated from adjacent regions via an insulating material 120.

According to embodiments which are illustrated in FIG. 1, the gold layer 105 is arranged over the second current spreading layer 115 and connected to it. The gold layer 105 is arranged between the substrate 100 and the converter element 108. For example, the gold layer 105 may be arranged on a side of the second current spreading layer 115 that is remote from the substrate 100. According to further embodiments, the gold layer 105 may constitute the second current spreading layer 115. Correspondingly, the gold layer 105 is connected to the second semiconductor layer 130 via the second contact regions 118.

The converter element 108 is arranged over the first main surface 145 of the second semiconductor layer 130. The converter element contains, for example, a phosphor and is suitable for converting a wavelength of the emitted electromagnetic radiation into higher wavelengths. For this purpose, electromagnetic radiation emitted by the semiconductor layer sequence is absorbed by the converter element 108. Electromagnetic radiation is subsequently emitted with longer wavelength. For example, the phosphor used may be a yellow phosphor, which, when excited by the light of the blue LED chip, is suitable for emitting yellow light. The converter element 108 may comprise multiple different phosphors, each emitting different wavelengths.

Examples of phosphors are metal oxides, metal halides, metal sulfides, metal nitrides, and others. These compounds may, furthermore, contain additions leading to the emission of specific wavelengths. The additions may comprise rare earth materials, for example. As an example of a yellow phosphor, it is possible to use YAG:Ce$^{3+}$ (cerium-activated yttrium aluminum garnet $(Y_3Al_5O_{12})$) or $(Sr_{1.7}Ba_{0.2}Eu_{0.1})$ $SiO_4$. Further phosphors may be based on $MSiO_4$:Eu$^{2+}$, in which M may be Ca, Sr or Ba. Through selection of the cations with an appropriate concentration it is possible to select a desired conversion wavelength. Many further examples of suitable phosphors are known.

According to applications, the phosphor material—a phosphor powder, for example—may be embedded in a suitable matrix material. For example, the matrix material may comprise a resin composition or polymer composition such as a silicone resin or an epoxy resin, for example. The size of the phosphor particles may be situated, for example, in a micrometer or nanometer range.

According to further versions, the matrix material may comprise a glass. For example, the converter material may be formed by sintering the glass, $SiO_2$ for example, with further additions and phosphor powder, to form a phosphor in glass (PiG).

According to further versions, the phosphor material may itself be sintered to form a ceramic. The ceramic phosphor, for example, may have a polycrystalline structure as a result of the sintering process.

According to further versions, the phosphor material may be grown to form a monocrystalline phosphor, using the Czochralski (Cz) process, for example.

According to further versions, the phosphor material itself may be a semiconductor material, which in the volume or in layers has a suitable bandgap for absorbing the light emitted by the LED and for emitting the desired conversion wavelength. In particular, this material may be an epitaxially grown semiconductor material. The epitaxially grown semiconductor material may, for example, have a bandgap corresponding to a lower energy than that of the light emitted primarily. Moreover, multiple suitable semiconductor layers, each emitting light of different wavelengths, may be stacked one over another. One or more quantum wells, quantum dots or quantum wires may be formed in the semiconductor material.

The converter element is, for example, assembled mechanically with the semiconductor layer stack 103 via an adhesive material 119. The converter element 108 may directly border the second semiconductor layer 130. For example, the converter material 108 may be configured as a plate which is connected to the semiconductor layer stack 103 via the adhesive 119. For example, the adhesive 119 may be configured as a layer. According to embodiments, the adhesive 119 may fill the space between the converter element 108 and the edge region 104. The converter element 108 overlaps with the edge region 104 of the substrate. In other words, the converter element also covers regions of the substrate in which the semiconductor layer stack 103 is not arranged. At the side remote from the semiconductor layer stack 103, the converter element 108 may border air. A layer thickness of the converter element 108 may be less than 300 μm. The thickness of the converter element 108 may be less than half of one chip edge length. The converter element 108 may have a comparatively high degree of conversion. A degree of conversion, i.e., the ratio of converted photons to the total number of photons emitted, may be greater than 50%.

Between the edge region 104 of the substrate and the converter element 108 there is excess adhesive or else encapsulating material present, for example. The optoelectronic semiconductor component 10 is sealed laterally via a polymer material or a silicone resin 113, as for example a silicone resin 113 which contains a $TiO_2$ filler and takes the form of white silicone resin.

As represented, for example, in FIG. 1, no conducting or semiconducting layers are provided over the gold layer 105 in the edge region.

As described, the gold layer 105 is arranged over an edge region 104 of the substrate 100. The term "edge region" of the substrate here denotes the region of the substrate that is not covered with semiconductor material. The edge region 104 constitutes the region outside the mesa 109. As illustrated in FIG. 1, insulating layers, such as the insulating layer 116 or the dielectric mirror layer 121, for example, may be arranged between the gold layer 105 in the edge region and the converter element 108.

Correspondingly, electromagnetic radiation which has been generated by the optoelectronic semiconductor layer stack 103 is absorbed by the converter element 108. Electromagnetic radiation is subsequently emitted by the converter element 108 with greater wavelength in any desired direction. This radiation will impinge on the gold layer in the edge region and be reflected by said layer. Since, as a result of the absorption by the converter element 108 and the subsequent emission, the wavelength of the electromagnetic radiation generated is increased, the reflectivity of the gold layer 105 may be skillfully exploited. The gold layer 105 has an increased reflectivity for longer-wave radiation. As a consequence, a high proportion of the electromagnetic radiation which impinges on the edge region 104 of the substrate 100 can be reflected back by the gold layer 105 in the direction of the converter element.

As a result, the outcoupling efficiency of the optoelectronic semiconductor component is increased. Because of the geometry described, the gold layer provides a comparatively high reflectivity in a wavelength range which corresponds to that of the light emitted by the converter element. Stated more precisely, the gold layer is arranged at a position on which radiation emitted by the converter element 108 impinges. Correspondingly, although gold possesses a reduced reflectivity in a blue wavelength range, a high reflectivity can be achieved, owing to the red shift of the incident radiation. Correspondingly, through a skillful arrangement of the gold layer, the increased reflectivity of gold can be exploited for larger wavelengths. Furthermore, with the use of gold, a highly reflective metal which is protected from environmental effects is employed in the edge region. As a result, overall, the brightness of the LED can be increased.

According to embodiments which are described with reference to FIG. 1, the gold layer 105 is electrically connected to the second current spreading layer 115.

Figure 2:
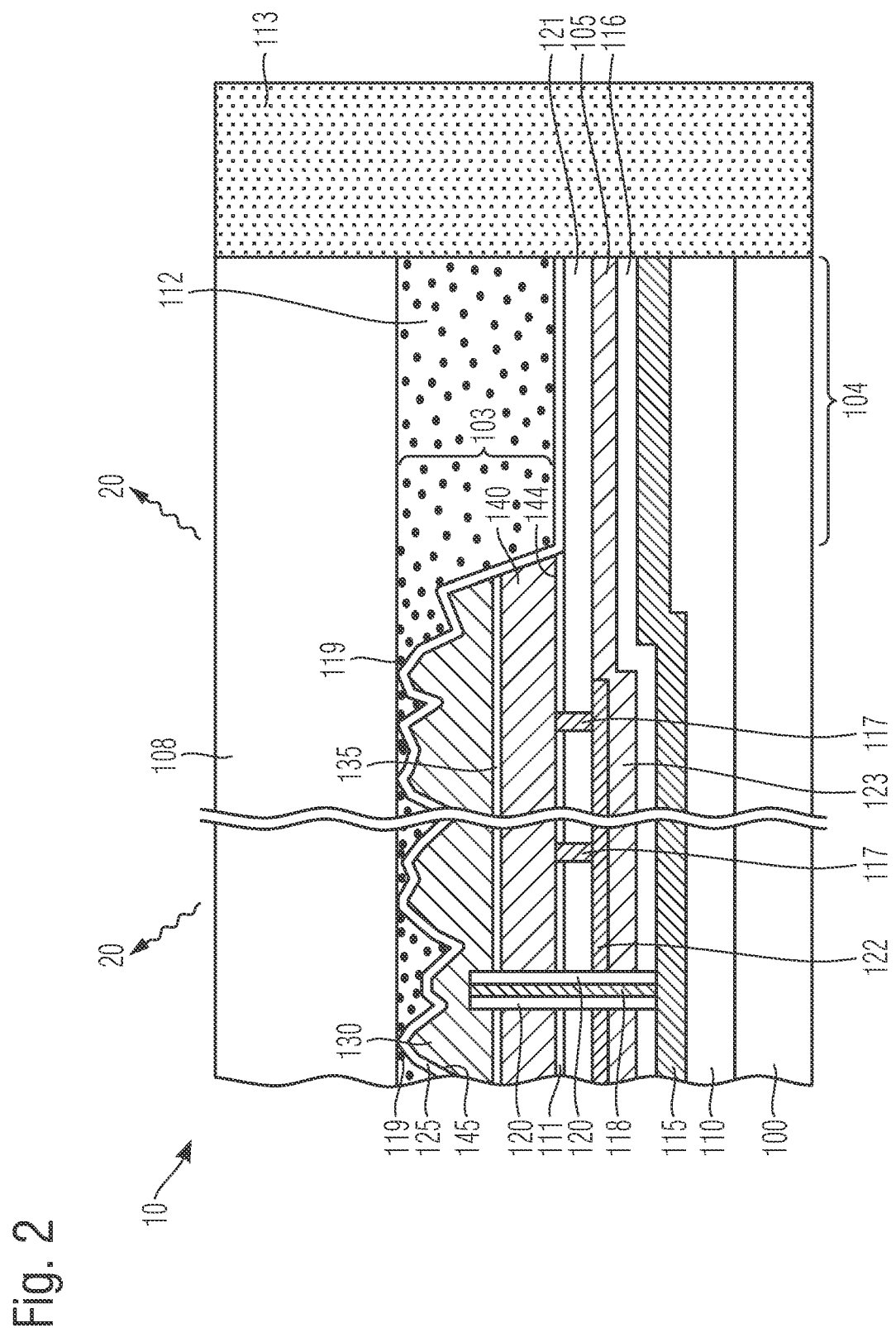
FIG. 2 shows a cross-sectional view through an optoelectronic semiconductor component according to further embodiments.

FIG. 2 shows a cross-sectional view of an optoelectronic semiconductor component according to further embodiments. Departing from embodiments which are illustrated in FIG. 1, the gold layer 105 here is connected to the first current spreading layer 123. For example, the gold layer 105 may extend under the semiconductor layer stack. Expressed alternatively, a part of the gold layer 105 may overlap vertically with the mesa 109. For example, the gold layer 105 may constitute the first current spreading layer. For example, insulating material 116 may be arranged between the gold layer 105 and the substrate 100. A diffusion barrier (not represented), which may contain Pt, Cr, Ti and Ni, for example, may be arranged between the gold layer 105 and the metallic mirror layer 122.

As represented in FIG. 2, the gold layer 105 may be arranged on a side of the dielectric mirror layer 121 that is remote from the converter element 108. For example, the gold layer may directly border the dielectric mirror layer 121.

Further features of the optoelectronic semiconductor component are embodied in accordance with the elements represented in FIG. 1.

Figure 3:
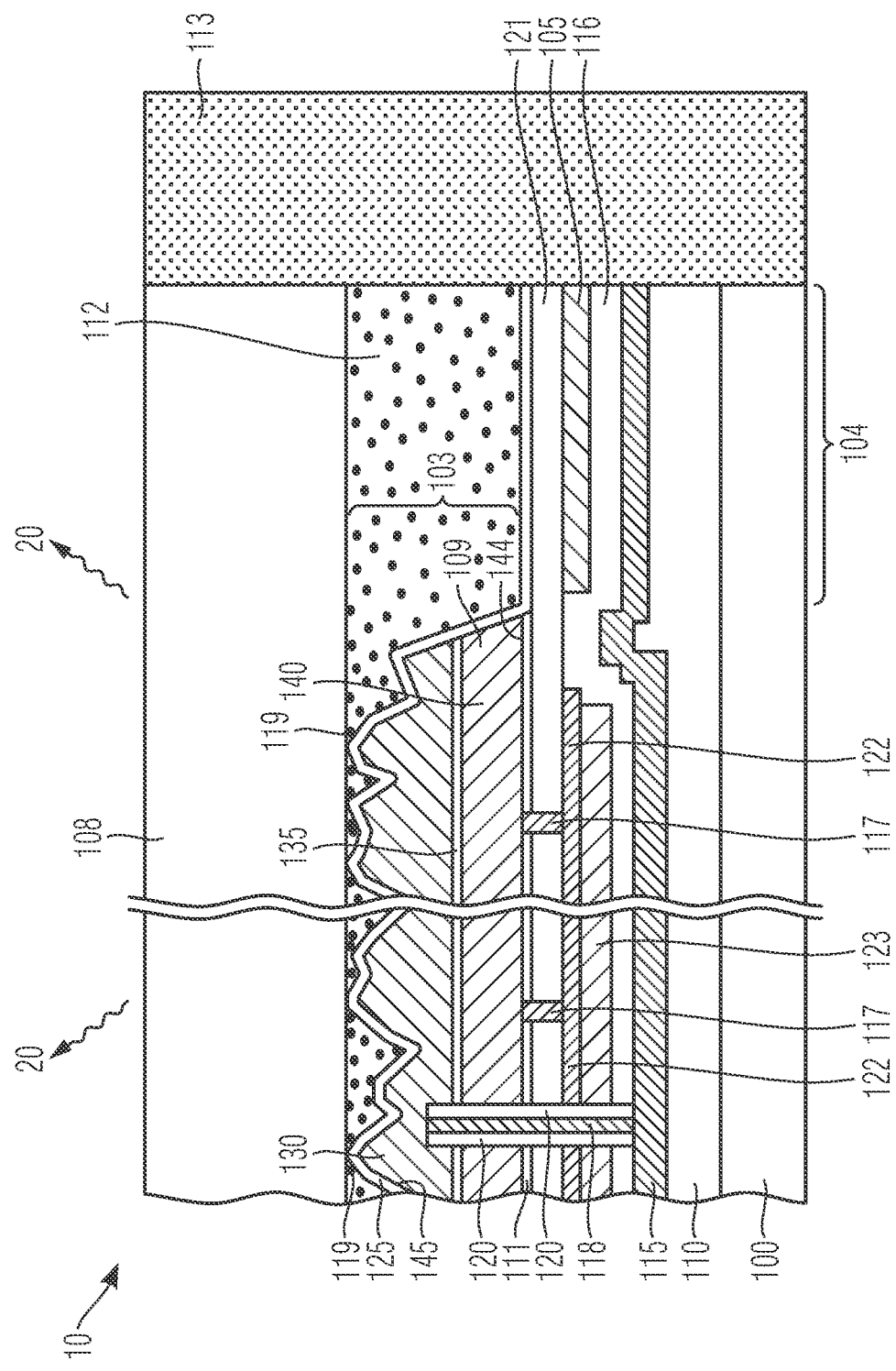
FIG. 3 shows a cross-sectional view through an optoelectronic semiconductor component according to further embodiments.

According to further embodiments, the gold layer 105 may also be electrically insulated from the first and the second current spreading layer 123, 115. This is illustrated in FIG. 3. As can be seen, the gold layer 105 is electrically insulated from the first current spreading layer 123. Moreover, the gold layer 105 is insulated from the second current spreading layer 115. As shown in FIG. 3, the gold layer 105 may be arranged exclusively over the edge region 104 of the substrate. This means that it does not, for example, extend into the region below the semiconductor layer stack 103.

For example, the gold layer 105 may be arranged on a side of the second current spreading layer 115 that is remote from the substrate 100.

As represented in FIG. 3, the gold layer 105 may be arranged on a side of the dielectric mirror layer 121 that is remote from the converter element 108. For example, the gold layer may directly border the dielectric mirror layer 121.

Further features of the optoelectronic semiconductor component are embodied in accordance with the elements represented in FIG. 1.

Although specific embodiments have been illustrated and described herein, those skilled in the art will recognize that the specific embodiments shown and described may be replaced by a multiplicity of alternative and/or equivalent configurations without departing from the scope of protection of the invention. The specification is intended to cover any adaptations or variations of the specific embodiments discussed herein. The invention is therefore limited only by the claims and their equivalents.

The invention claimed is:

1. An optoelectronic semiconductor component comprising:
    a semiconductor layer stack configured to generate electromagnetic radiation, the semiconductor layer stack being arranged over a substrate and being structured to form a mesa, so that the semiconductor layer stack is not present over an edge region of the substrate;
    a converter element on a side of the semiconductor layer stack remote from the substrate and over the edge region of the substrate; and
    a gold layer over the edge region of the substrate in an arrangement plane between the substrate and the semiconductor layer stack;
    wherein the semiconductor layer stack comprises:
        a first semiconductor layer of a first conductivity type,
        a second semiconductor layer of a second conductivity type,
        a first current spreading layer connected to the first semiconductor layer, and
        a second current spreading layer connected to the second semiconductor layer; and
    wherein a dielectric mirror layer is arranged between the semiconductor layer stack and the first current spreading layer, the gold layer being arranged on a side of the dielectric mirror layer that is remote from the converter element.

2. The optoelectronic semiconductor component as claimed in claim 1, wherein the first current spreading layer is arranged between the second current spreading layer and the semiconductor layer stack, and the first semiconductor layer being arranged between the second semiconductor layer and the first current spreading layer.

3. The optoelectronic semiconductor component as claimed in claim 1, wherein the gold layer is electrically connected to the second current spreading layer.

4. The optoelectronic semiconductor component as claimed in claim 3, wherein the gold layer is arranged on a side of the second current spreading layer that is remote from the substrate.

5. The optoelectronic semiconductor component as claimed in claim 1, wherein the gold layer is electrically connected to the first current spreading layer.

6. The optoelectronic semiconductor component as claimed in claim 5, wherein the gold layer directly borders the dielectric mirror layer.

7. The optoelectronic semiconductor component as claimed in claim 1, wherein the gold layer is electrically insulated from the first current spreading layer and from the second current spreading layer.

8. The optoelectronic semiconductor component as claimed in claim 1, wherein the converter element overlaps with the edge region of the substrate.

9. The optoelectronic semiconductor component as claimed in claim 1, wherein the converter element is fastened via an adhesive on the semiconductor layer stack.

10. The optoelectronic semiconductor component as claimed in claim 9, wherein the converter element is configured as a lamina.

11. The optoelectronic semiconductor component as claimed in claim 1, further comprising a second contact region for electrically connecting the second semiconductor layer to the second current spreading layer, which runs through an inner region of the mesa.

12. The optoelectronic semiconductor component as claimed in claim 1, wherein between the gold layer over the edge region of the substrate and the converter element over the edge region of the substrate is free from conducting layers or semiconductor layers.

* * * * *